United States Patent
Yi et al.

(10) Patent No.: US 10,580,968 B1
(45) Date of Patent: Mar. 3, 2020

(54) INTEGRATED CIRCUIT WITH MEMORY CELLS HAVING RELIABLE INTERCONNECTION

(71) Applicant: GLOBALFOUNDRIES Singapore Pte. Ltd., Singapore (SG)

(72) Inventors: Wanbing Yi, Singapore (SG); Curtis Chun-I Hsieh, Singapore (SG); Yi Jiang, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/159,772

(22) Filed: Oct. 15, 2018

(51) Int. Cl.
| | |
|---|---|
| *H01L 43/02* | (2006.01) |
| *H01L 43/12* | (2006.01) |
| *H01L 27/22* | (2006.01) |
| *G11C 11/16* | (2006.01) |
| *H01L 27/12* | (2006.01) |

(52) U.S. Cl.
CPC ............ *H01L 43/02* (2013.01); *G11C 11/161* (2013.01); *H01L 27/1222* (2013.01); *H01L 43/12* (2013.01)

(58) Field of Classification Search
CPC ...... H01L 43/02; H01L 27/222; G11C 11/161
USPC ...................................................... 257/421
See application file for complete search history.

(56) References Cited

U.S. PATENT DOCUMENTS

| | | | |
|---|---|---|---|
| 9,865,649 B2 | 1/2018 | Tan et al. | |
| 9,905,282 B1 | 2/2018 | Yi et al. | |
| 10,062,733 B1* | 8/2018 | Yi | ............... H01L 43/12 |
| 2016/0351797 A1* | 12/2016 | Yi | ............... H01L 43/12 |
| 2018/0175284 A1 | 6/2018 | Hsieh et al. | |

OTHER PUBLICATIONS

Yong Kyu Lee et al, "Embedded STT-MRAM in 28-nm FDSOI Logic Process for Industrial MCU/IoT Application", 2018 Symposium on VLSI Technology Digest of Technical Papers, 2018, pp. 181-182, IEEE.

* cited by examiner

*Primary Examiner* — Tong-Ho Kim
(74) *Attorney, Agent, or Firm* — Viering Jentschura & Partner MBB

(57) ABSTRACT

In a non-limiting embodiment, a device may be formed having a substrate that has at least a first region and a second region. The first region includes a memory region having at least one magnetic tunnel junction (MTJ) stack, and the second region includes a logic region. An encapsulation stack is formed in the first and second regions and over the MTJ stack(s). The encapsulation stack includes a first layer, a second layer, and a third layer. A single etch may remove at least a portion of the third layer, the second layer, and the first layer of the encapsulation stack to form a self-aligned MTJ via opening over the at least one MTJ stack to form one or more peaks from the encapsulation stack above or around the MTJ stack.

15 Claims, 9 Drawing Sheets

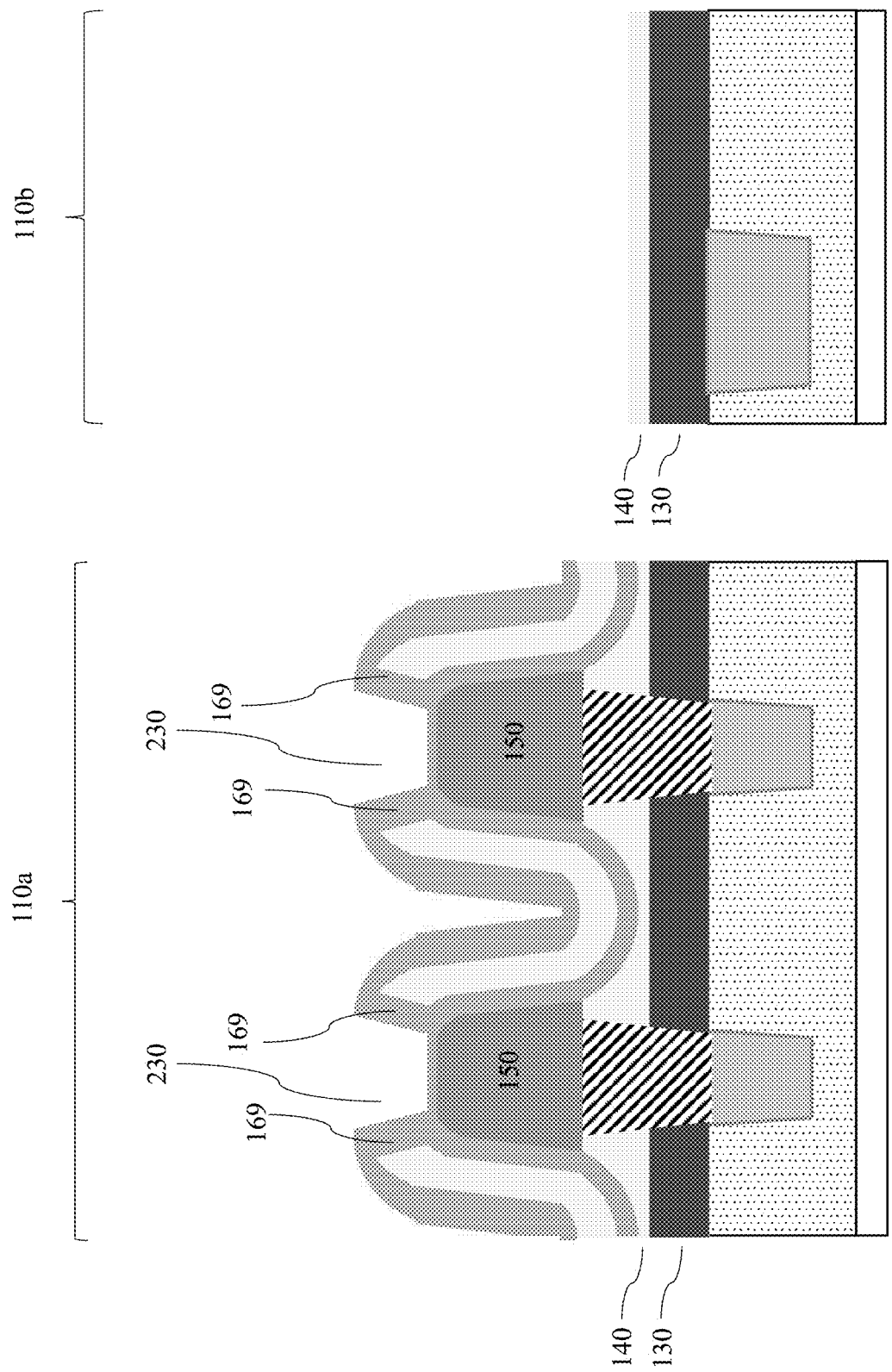

INTEGRATED CIRCUIT WITH MEMORY CELLS HAVING RELIABLE INTERCONNECTION

TECHNICAL FIELD

The present disclosure relates generally to integrated circuits having memory elements and logic devices, and methods of forming the same.

BACKGROUND

As technology evolves into era of sub-micron, there is a desire to integrate various memory elements with high speed logic circuit elements into a single chip or an integrated circuit (IC) to form an embedded memory. For example, magnetic random access memory (MRAM) cells include magnetic tunnel junction (MTJ) elements, or stacks sandwiched between top and bottom electrodes, or terminals which are generally connected to interconnects in dielectric layers. During integration, the process windows and reliabilities of the MRAM cells may degrade due to process limitations.

For example, the formation of the electrical connection to the top of the MRAM cell includes forming a dielectric layer over the MRAM cell, smoothing the surface of that dielectric layer with planarization, etching a via through the dielectric layer, and then forming an interconnect within the open via. The process variation in the planarization and etching process is more than a dimension of the top layer of the MRAM cell. As a result, the interconnect extending to the top layer of the MRAM cell is not long enough in some cases such that a portion of the dielectric remains between the interconnect and the MRAM cell and the circuit is permanently open. In other instances, the interconnect is too long and passes through the top layer of the MRAM cell so the MRAM cell is permanently shorted. One option is to use middle etch stop layer (ESL) to cover the variations, however, this is not compatible with logic processing and has a much larger RC compared with scheme without ESL.

Accordingly, it is desirable to provide integrated circuits and methods of forming such integrated circuits with MRAM cells and interconnects where the interconnect reliably forms an electrical connection with the MRAM cell without shorting the MRAM cell and which is compatible with logic processing.

SUMMARY

Embodiments generally relate to integrated circuit (IC) devices and method for forming an IC device. In some embodiments, a device includes a substrate having at least a first region and a second region. A first dielectric layer is arranged over a capping layer in the first region and the second region. The first dielectric layer and the capping layer are arranged over the substrate. The first region includes a memory region over the first dielectric layer. The second region includes a logic region. The device further includes at least one magnetic tunnel junction (MTJ) stack arranged in the first region and a self-aligned MTJ via opening over the at least one MTJ stack. An encapsulation stack is disposed around the MTJ stack. The encapsulation stack includes a first layer over the first dielectric layer, a second layer over the first layer, and a third layer over the second layer. The encapsulation stack further includes one or more peaks above the MTJ stack. Another dielectric layer is at least partially disposed along a sidewall of the one or more peaks to form one or more spacers around the at least one MTJ stack. An MTJ upper interconnect is disposed in the MTJ via opening and over the MTJ stack. The upper interconnect is self-aligned to the one or more peaks of the encapsulation stack.

In some embodiments, a method for forming a device is provided. The method includes obtaining a substrate having at least a first region and a second region. A first dielectric layer is arranged over the substrate in the first region and the second region. The first region includes a memory region having at least one magnetic tunnel junction (MTJ) stack over the first dielectric layer, and the second region includes a logic region. An encapsulation stack is formed over the first dielectric layer in the first region and the second region and over the at least one MTJ stack. The encapsulation stack includes a first layer over the first dielectric layer, a second layer over the first layer, and a third layer over the second layer. A single etch is performed to remove at least a portion of the third layer, the second layer, and the first layer of the encapsulation stack to form a self-aligned MTJ via opening over the at least one MTJ stack. One or more peaks from the encapsulation stack are formed above the MTJ stack and the single etch also removes the second and third encapsulation layers from the second region. Another dielectric material is deposited at least partially along a sidewall of the one or more peaks to form one or more spacers around the at least one MTJ stack. The one or more spacers enable formation of a self-aligned interconnect in the MTJ via opening over the at least one MTJ stack.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 2A-2H show cross-sectional views of an embodiment of a process for forming a device.

DETAILED DESCRIPTION

Figure 1:
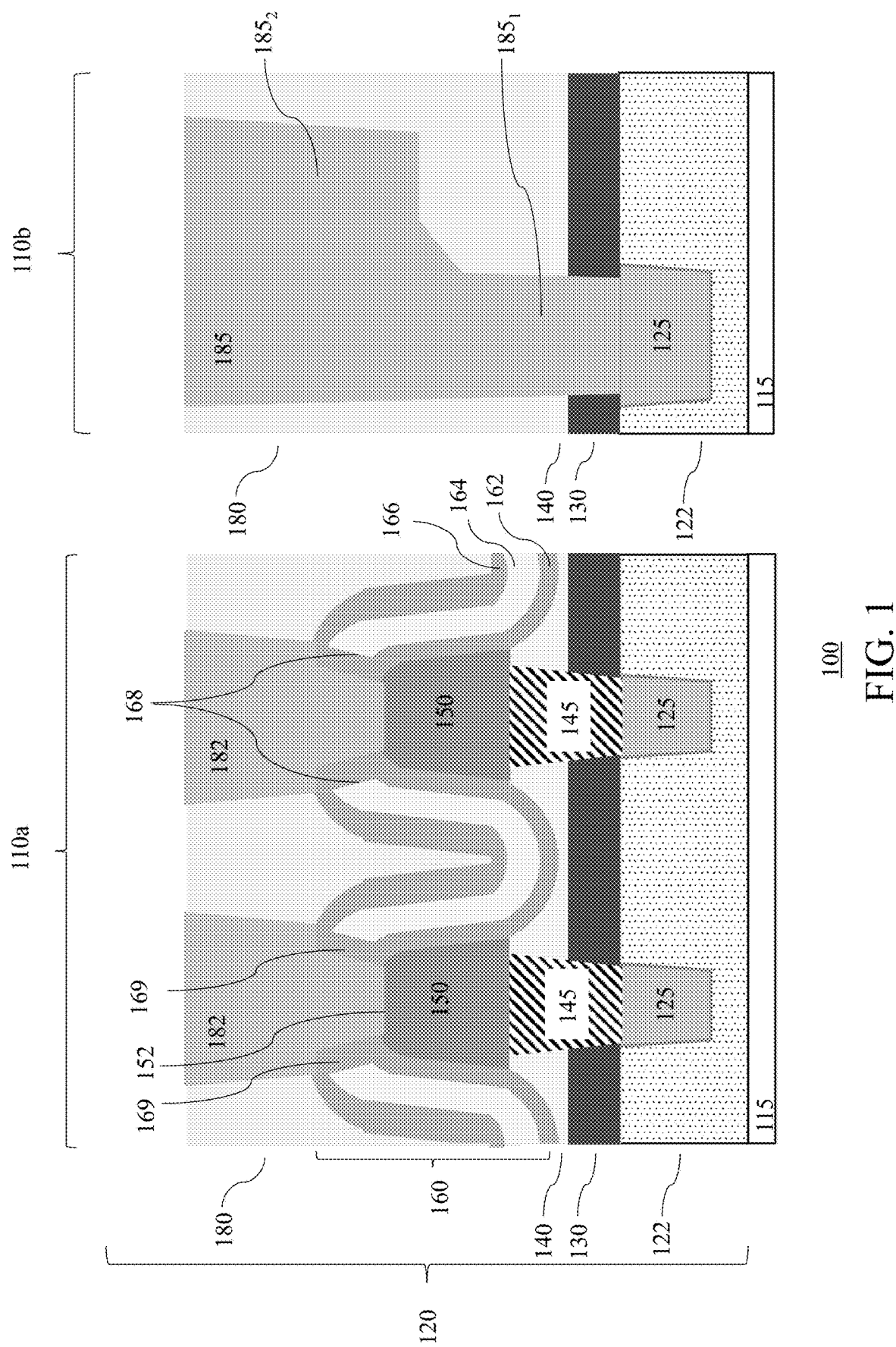
FIG. 1 shows a cross-sectional view of logic and memory regions of an embodiment of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to cost-effective and reliable integration of a memory element with logic device in an integrated circuit (IC). For example, the memory element may be an MTJ element of an MRAM cell in a non-limiting embodiment.

Embodiments of the present disclosure, as will be described, allows reliable integration of the MTJ element in an interlevel dielectric of an IC using logic processing. The embodiments address open and shorting problems that may arise in forming interconnection over memory elements, such as MTJ elements. It is understood that embodiments of the present disclosure are also applicable to other suitable types of memory element, such as resistive random access memory in a non-limiting embodiment. Such a memory element together with logic components may be based on any suitable technology node. The memory device together with the logic components may be incorporated into stand-alone memory devices including, but not limited to, Universal Serial Bus (USB) or other types of portable storage units, or ICs, such as microcontrollers or system on chips (SoCs). The devices or ICs may be incorporated into or used with, for example, consumer electronic products, or relate to other types of devices.

FIG. 1 shows an exemplary cross-sectional view of an embodiment of a device 100.

The device 100 may be an IC having a first region 110a and a second region 110b. The IC may also include other types of device regions (not shown). In one non-limiting embodiment, the first region 110a may be a memory region while the second region 110b may be a logic region. For example, the first region may include memory cells while the second region may include logic components. The memory cells, for example, may be magnetic random access memory (MRAM) cells in a non-limiting embodiment. In one embodiment, the first region 110a may include one or more storage or memory elements which may be disposed in an interlevel dielectric of the IC as will be described.

The device 100 may include a substrate 115. The substrate, for example, may be a semiconductor substrate, such as a silicon substrate. For example, the substrate may be a lightly doped p-type substrate in a non-limiting embodiment. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of substrates nay also be useful.

One or more electronic components (not illustrated) may be formed over and/or within the substrate in the first region 110a and the second region 110b as well as other device regions on the substrate. The electronic components may include, for example, transistors, capacitors, resistors, and diodes. For example, cell transistors of the memory cells and logic transistors of the logic components may be disposed over and/or within the substrate. For example, the memory cell transistors may be disposed in the first region 110a and the logic transistors may be disposed in the second region 110b of the same substrate. Other types of components may also be disposed over and/or within the substrate. The substrate may include isolation regions such as shallow trench isolation (STI) regions (not shown). The isolation regions, for example, isolates the memory cell region 110a and logic region 110b as well as other device regions. The isolation regions, for example, may also isolate columns of memory cells in the memory cell region. Other configurations of isolation regions may also be useful.

An interlevel dielectric 120 may be formed over the substrate in the first and second regions 110a and 110b. For example, the interlevel dielectric 120 may be formed over the components on the substrate. The interlevel dielectric 120, for example, may include a plurality of interlevel dielectric (ILD) layers. For example, the interlevel dielectric includes a plurality of ILD levels. The interlevel dielectric, for example, may be formed by back-end-of-line (BEOL) processing in a non-limiting embodiment. The number of ILD levels may depend on, for example, design requirements or the logic process involved. The ILD layers of the interlevel dielectric 120, for example, may be formed of one or more dielectric materials, such as low-k dielectric (e.g., SiCOH), silicon oxide, silicon nitride and etc. The dielectric layers may be formed by chemical vapor deposition (CVD). Other suitable material and techniques for forming the ILD layers may also be useful.

The interlevel dielectric may include interconnects disposed in the ILD layers (not fully illustrated in the interest of brevity). The interconnects connect the various components of the IC to perform the desired functions. For example, an ILD level may include a metal level and a contact level in the first and second regions 110a and 110b. For example, a metal level includes conductors or metal lines 125 while the contact level includes via contacts (not shown). It is understood that there could be a plurality of metal lines in the same metal level of the first and second regions 110a and 110b. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper levels of the interlevel dielectric 120, the conductors and via contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different.

In one embodiment, the interlevel dielectric 120 may include a capping layer 130 in the first and second regions 110a and 110b. The capping layer, for example, may be formed over an ILD layer (e.g., base dielectric layer 122) and metal lines 125 of the interlevel dielectric 120. The capping layer, for example, serves as an etch stop layer and prevents out-diffusion of metal or conductive material such as copper out-diffusion in a non-limiting embodiment. The capping layer, for example, may be formed of a silicon nitride (SiN) layer or NBLoK (NBLoK is a trademark of Applied Materials, Inc.), such as a carbon-doped silicon nitride (SiCN) in a non-limiting example. Using the SiCN material provides a lower k value for the capping layer relative to SiN. Other suitable types of dielectric materials for the capping layer 130 may also be useful.

In one embodiment, the interlevel dielectric 120 includes a first dielectric layer 140. The first dielectric layer 140 may be disposed over the capping layer 130. The first dielectric layer 140, for example, may correspond to any ILD level of the interlevel dielectric. The first dielectric layer 140 may be formed of a low-k dielectric material. For example, the first dielectric layer 140 may be formed of SiCOH in a non-limiting embodiment. In other embodiments, the first dielectric layer may be an oxide layer such as a silicon oxide layer.

Lower interconnects 145 may be disposed in the capping layer 130 and the first dielectric layer 140 in the first region 110a. In one embodiment, the lower interconnects 145 may provide electrical connection to memory elements on which they are disposed. The lower interconnects 145 may be formed of a conductive material. For example, the lower interconnects may be formed copper (Cu), tungsten (W), tantalum (Ta), titanium (Ti), tantalum nitride (TaN) and titanium nitride (TiN). Other types of conductive material may also be useful. In some embodiments, the lower interconnects 145 may serve as electrodes of the memory elements. For example, the lower interconnects 145 may serve as bottom electrodes of the MTJ elements or stacks. For example, the bottom electrode of the memory element is coupled to other interconnects of the interlevel dielectric such as the metal line 125. "Lower" and "upper" with respect to the MTJ interconnects refers to the location of the interconnects in relation to the MTJ stack; a lower interconnect is below the MTJ stack, and an upper interconnect is above the MTJ stack.

Memory elements may be disposed over the substrate in the first region. In one embodiment, the memory elements may be disposed over or on the first dielectric layer 140. The memory elements, in one embodiment, may be MTJ elements or stacks 150. The MTJ stacks 150 may be pillar-shaped in a non-limiting embodiment. The pillar-shaped MTJ stacks are obtained by lithography and etch processes in another non-limiting example. A top surface 152 of the MTJ stack may be substantially planar. An MTJ stack, for example, may include a magnetically fixed (pinned) layer, one or more tunneling barrier layers and a magnetically free layer. The fixed layer may include a magnetic layer and a pinning layer. The pinning layer, for example, pins the magnetization direction of the magnetic layer, forming a pinned layer. The bottom-pinned MTJ element is formed by having the magnetically fixed layer disposed below the magnetically free layer while the top pinned MTJ element is formed by having the fixed layer disposed above the free layer. Other configurations of the MTJ stacks may also be useful.

The MTJ stack may be a bottom-pinned MTJ element or a top-pinned MTJ element. For example, the bottom-pinned MTJ element may be formed by having the magnetically fixed layer disposed below the magnetically free layer, while the top pinned MTJ element may be formed by having the fixed layer disposed above the free layer. In non-limiting embodiments, the free layer and the fixed layer may be a composite-based material, such as but not limited to CoFeB, CoFe, or combinations thereof. The tunneling barrier layer may have or include a material, such as but not limited to, MgO, $Al_2O_3$, or combinations thereof. As for the pinning layer, it may be formed of a material, such as but not limited to, PtMn, IrMn, or combinations thereof. Other materials for forming the MTJ stack may also be useful. Additionally, other suitable types of memory elements may also be useful.

In one embodiment, an encapsulation stack 160 may be disposed around the MTJ stacks 150. The encapsulation stack 160, for example, may be formed on sidewalls of the MTJ stacks. In one embodiment, the encapsulation stack 160 includes a first encapsulation layer 162, a second encapsulation layer 164 and a third encapsulation layer 166. For example, the first encapsulation layer 162 may be disposed over the first dielectric layer 140, the second encapsulation layer 164 may be disposed over the first encapsulation layer 162, and the third encapsulation layer 166 may be disposed over the second encapsulation layer 164. In one embodiment, the encapsulation stack includes one or more peaks 168 above the MTJ stack. For example, the encapsulation stack includes one or more peaks 168 which are disposed above the top surface 152 of the MTJ stack.

The layers of the encapsulation stack may be formed of dielectric material. For example, the first encapsulation layer 162, the second encapsulation layer 164 and the third encapsulation layer 166 are dielectric layers. The second encapsulation layer 164 is selected such that it has a faster etch rate than the first and third encapsulation layers 162 and 166. In one non-limiting embodiment, the first encapsulation layer 162 may be formed of silicon nitride, the second encapsulation layer 164 may be formed of oxide such as silicon oxide and third encapsulation layer 166 may be formed of silicon nitride. Other suitable types of dielectric materials for the encapsulation stack may also be useful.

In one embodiment, another dielectric layer 169 may be at least partially disposed along a sidewall of the one or more peaks of the encapsulation stack to form one or more spacers around each MTJ stack. In one embodiment, the additional dielectric layer 169 may be formed of silicon nitride in a non-limiting embodiment. The encapsulation stack having the first encapsulation layer 162, the second encapsulation layer 164 and the third encapsulation layer 166, and the dielectric layer 169 form dielectric spacers around the MTJ stacks. The dielectric spacers, in one embodiment, defines the MTJ via openings around/over the MTJ stacks. For example, the peaks 168 of the encapsulation stack and the dielectric layer 169 defines each MTJ via opening over the MTJ stack.

A second dielectric layer 180 may be disposed over the first dielectric layer 140, the MTJ stacks 150 and the encapsulation stack 160 in the first region 110a, and over the first dielectric layer 140 in the second region 110b. The second dielectric layer 180, for example, includes MTJ upper interconnects 182 disposed over the MTJ stacks. The second dielectric layer 180, for example, may correspond to another ILD layer of the interlevel dielectric 120. The second dielectric layer 180, for example, may be formed of a low-k dielectric material. The second dielectric layer 180, for example, may be formed of SiCOH in a non-limiting embodiment. Other suitable configurations and materials for the second dielectric layer 180 may also be useful.

The MTJ upper interconnects 182 may be disposed over the one or more MTJ stacks 150. An MTJ upper interconnect, for example, may have a via portion $182_1$ and a trench portion $182_2$. For example, the via portion $182_1$ may be disposed in the MTJ via opening, while the trench portion $182_2$ may be disposed in a trench of the second dielectric layer 180. The trench portion $182_2$, for example, may be centered above the MTJ stack. The MTJ upper interconnects 182 may be self-aligned to the dielectric spacers of the MTJ stack. For example, the via portion $182_1$ of the MTJ upper interconnects may be self-aligned to the one or more peaks of the encapsulation stack. As shown, a dimension of the MTJ upper interconnect at the interface with the MTJ stack may be comparable or slightly smaller than a dimension of the top surface of the MTJ stack. The MTJ upper interconnect 182 may be formed of a conductive material. For example, the MTJ upper interconnect, for example, may be formed of Cu.

The capping layer 130, the first dielectric layer 140 and the second dielectric layer 180 may include a logic interconnect 185 in the second region 110b. For example, the capping layer 130, the first dielectric layer 140 and the second dielectric layer 180 include a logic interconnect 185 which is coupled to a metal line 125 in the logic region 110b. The logic interconnect 185, for example, may have a dual damascene interconnect structure. For example, the logic interconnect 185 may have a via portion $185_1$ and trench portion $185_2$ above the via portion. The logic interconnect may be formed of a conductive material, such as but not limited to copper (Cu), cobalt (Co), ruthenium (Ru), or combinations thereof. In one embodiment, the logic interconnect may be formed of the same conductive material as the MTJ upper interconnect over the MTJ stack. Although one logic interconnect 185 and one metal line 125 are illustrated in the second region 110b, it is understood that there could be any suitable number of logic interconnects and metal lines in the second region 110b.

FIGS. 2A-2H show simplified cross-sectional views of an embodiment of a process 200 for forming a device. The cross-sectional views of the process 200 are taken along first 110a and second region 110b of the device. In one embodiment, the process allows one or more memory cells to be formed with logic components on the same substrate. The memory cell, for example, may be an MRAM cell. The device formed, for example, is similar or the same as that shown and described in FIG. 1. As such, common elements may not be described or described in detail.

Figure 2A:
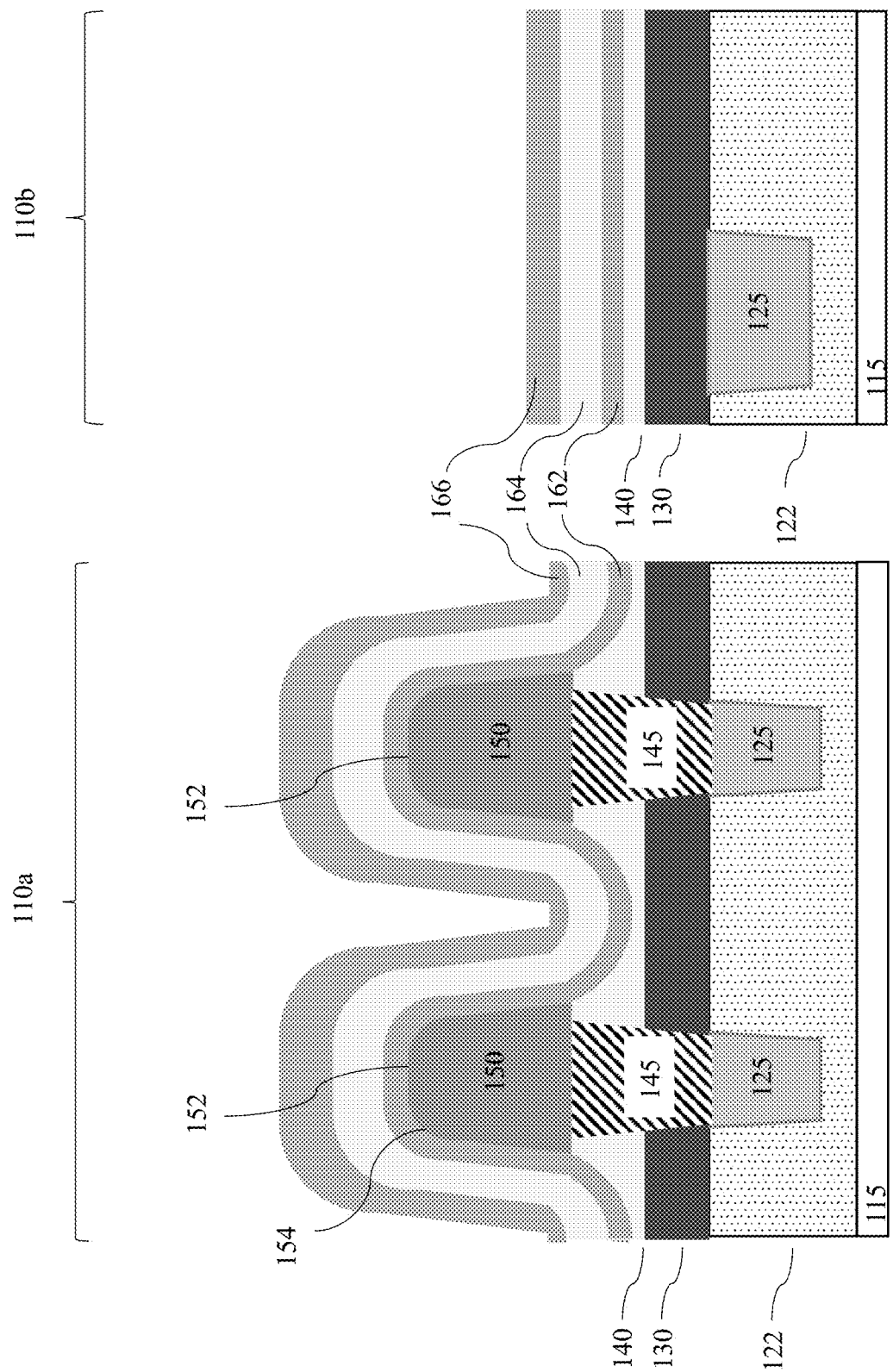

For simplicity of discussion and in interest of brevity, the processing of a substrate to form electronic components such as transistors are not shown. In some embodiments, the process 200 may include forming base or lower ILD layers 122 of an interlevel dielectric over the substrate using BEOL processing in a non-limiting embodiment. For example, one or more lower ILD levels of an interlevel dielectric may be formed. Referring to FIG. 2A, a base dielectric layer 122 is formed over a substrate 115. For example, the base dielectric layer 122 may be a dielectric layer of the interlevel dielectric over which one or more memory element(s) are formed in the first region 110a. The base dielectric layer 122 may include metal lines 125 in the first region 110a and in the second region 110b. For example, the metal lines 125 may be coupled to electronic components over and/or within the substrate by other metal lines and via contacts.

The base dielectric layer 122, for example, may be formed of a dielectric material, such as but not limited to, silicon oxide, silicon nitride, low-k dielectric materials such as SiCOH, or combinations thereof. The metal lines 125 may be formed of a conductive material such as, for example, Cu. Other suitable conductive materials may also be employed. It is understood that there may be other suitable number of metal lines formed in the base dielectric layer 122 in the first and second regions 110a and 110b. In one embodiment, one or more metal lines 125 in the first region 110a may be coupled to MTJ stacks while one or more metal line 125 in the second region 110b may be coupled to logic interconnects as will be described.

In one embodiment, a capping layer 130 and a first dielectric layer 140 may be formed over substrate in the first and second regions 110a and 110b. For example, the capping layer 130 and the first dielectric layer 140 may be formed over the base dielectric layer 122. The capping layer 130 may be formed over the base dielectric layer 122 covering the metal lines 125. The capping layer 130, for example, serves as an etch stop layer and prevents out-diffusion of metal or conductive material such as copper out-diffusion in a non-limiting embodiment. For example, the capping layer may be NBLoK. Other suitable types of dielectric materials for the capping layer, such as SiN, may also be useful.

The first dielectric layer 140, for example, may be formed on the capping layer 130. The first dielectric layer 140, in one embodiment, may be formed of a low-k dielectric material, such as SiCOH. The capping layer 130 and the first dielectric layer 140, for example, may be formed by chemical vapor deposition (CVD). Other suitable techniques and materials for forming the capping layer 130 and the first dielectric layer 140 may also be useful.

The capping layer 130 and the first dielectric layer 140 may include lower interconnects 145 in the first region 110*a*. In one embodiment, the lower interconnects 145 couples one or more MTJ stacks formed over them to the electronic components over and/or within the substrate. For example, the lower interconnects 145 may be formed over the metal lines 125 in the first region and couples the MTJ stacks to the metal lines 125. The lower interconnects 145 may be formed of a conductive material. As used herein, a conductive layer or conductive material may be or include, but is not limited to, copper (Cu), tungsten (W), tantalum (Ta), titanium (Ti), tantalum nitride (TaN), titanium nitride (TiN), or combinations thereof. In some embodiments, the lower interconnects 145 may serve as electrodes of the MTJ stacks. For example, the lower interconnects 145 may serve as bottom electrodes of the MTJ stacks. The lower interconnects 145 may be formed, for example, by electrochemical plating (ECP), chemical vapor deposition (CVD) or physical vapor deposition (PVD). Other suitable conductive materials and deposition techniques may also be useful.

In one embodiment, one or more MTJ stacks 150 may be formed in the first region 110*a*. As illustrated, two MTJ stacks are formed. It is understood that other numbers of MTJ stacks may be formed in the first region 110*a*. The MTJ stacks, for example, may be formed by physical vapor deposition (PVD). Other suitable techniques may also be used. For example, the MTJ stacks may be formed by depositing MTJ stack layers in the first and second regions 110*a* and 110*b*. The MTJ stacks layers may include a magnetically fixed layer over the lower interconnects 145 and the first dielectric layer 140, one or more tunneling barrier layers over the magnetically fixed layer, and a magnetically free layer over the tunneling barrier layers (not illustrated). In some embodiments, the magnetically fixed layer, the tunneling barrier layer, and/or the magnetically free layer may include sublayers. Other sequences or arrangement for forming the layers of the MTJ stack may also be useful, for example depending on a bottom-pinned or top-pinned MTJ element.

The MTJ stack layers may be patterned by lithography and etch techniques to form the MTJ stacks as described with respect to FIG. 1. For example, a soft mask layer, such as a photoresist layer may be formed over the MTJ stack layers. In some cases, a hard mask layer, such as a hard mask layer formed of silicon nitride, may be formed over the MTJ stack layers, and the photoresist layer may be formed over the hard mask layer. The photoresist layer may be deposited by spin coating, and patterned to form a pattern used to define the MTJ stack layers. The photoresist may be selectively exposed with an exposure source using a reticle (not shown). The pattern of the reticle is transferred to the photoresist after exposure by a development process. The patterned photoresist may then be used to define layers of the MTJ stack by removing portions of the layers of the MTJ stack not protected by the patterned photoresist in the first and second regions 110*a* and 110*b*. The MTJ stack layers may be etched in the exposed area to form the MTJ stacks 150 in the areas protected by the patterned photoresist. The layers of the MTJ stack are completely removed from the second region 110*b*. The MTJ stack layers may be etched anisotropically, such as with a plasma dry etch using an inert gas such as argon. As an example, the MTJ stacks may have the same configuration as that described with respect to FIG. 1. The MTJ stacks 150 may have a pillar-shaped profile with a substantially planar top surface 152. As illustrated in FIG. 2A, the etching process may form curved edges 154 of the MTJ stacks 150. Providing other shapes or configurations of the MTJ stacks or memory elements may also be useful. The patterned photoresist may be removed using suitable techniques, such as ashing in a non-limiting embodiment.

Dielectric spacers may be formed around the MTJ stacks. In one embodiment, an encapsulation stack may be formed over the substrate in the first and second regions 110*a* and 110*b*. The encapsulation stack, for example, may be formed over the first dielectric layer 140. In one embodiment, the encapsulation stack includes a first encapsulation layer 162, a second encapsulation layer 164, and a third encapsulation layer 166. For example, the first encapsulation layer 162 may be deposited over the MTJ stacks 150 and over the first dielectric layer 140 in the first and second regions 110*a* and 110*b*. The second encapsulation layer 164 may be deposited over the first encapsulation layer 162, and the third encapsulation layer 166 may be deposited over the second encapsulation layer 164.

The first encapsulation layer 162, the second encapsulation layer 164 and the third encapsulation layer 166 may be dielectric layers. The second layer encapsulation layer 164 is selected such that it has a faster etch rate than the first and third encapsulation layers 162 and 166. In one embodiment, the first encapsulation layer 162 may be formed of silicon nitride, the second encapsulation layer 164 may be formed of silicon oxide and third encapsulation layer 166 may be formed of silicon nitride. Other suitable types of dielectric materials for the encapsulation stack may also be useful. The first encapsulation layer 162, the second encapsulation layer 164 and the third encapsulation layer 166, for example, may be formed by CVD. Other techniques for forming the encapsulation layers may also be useful.

Figure 2B:
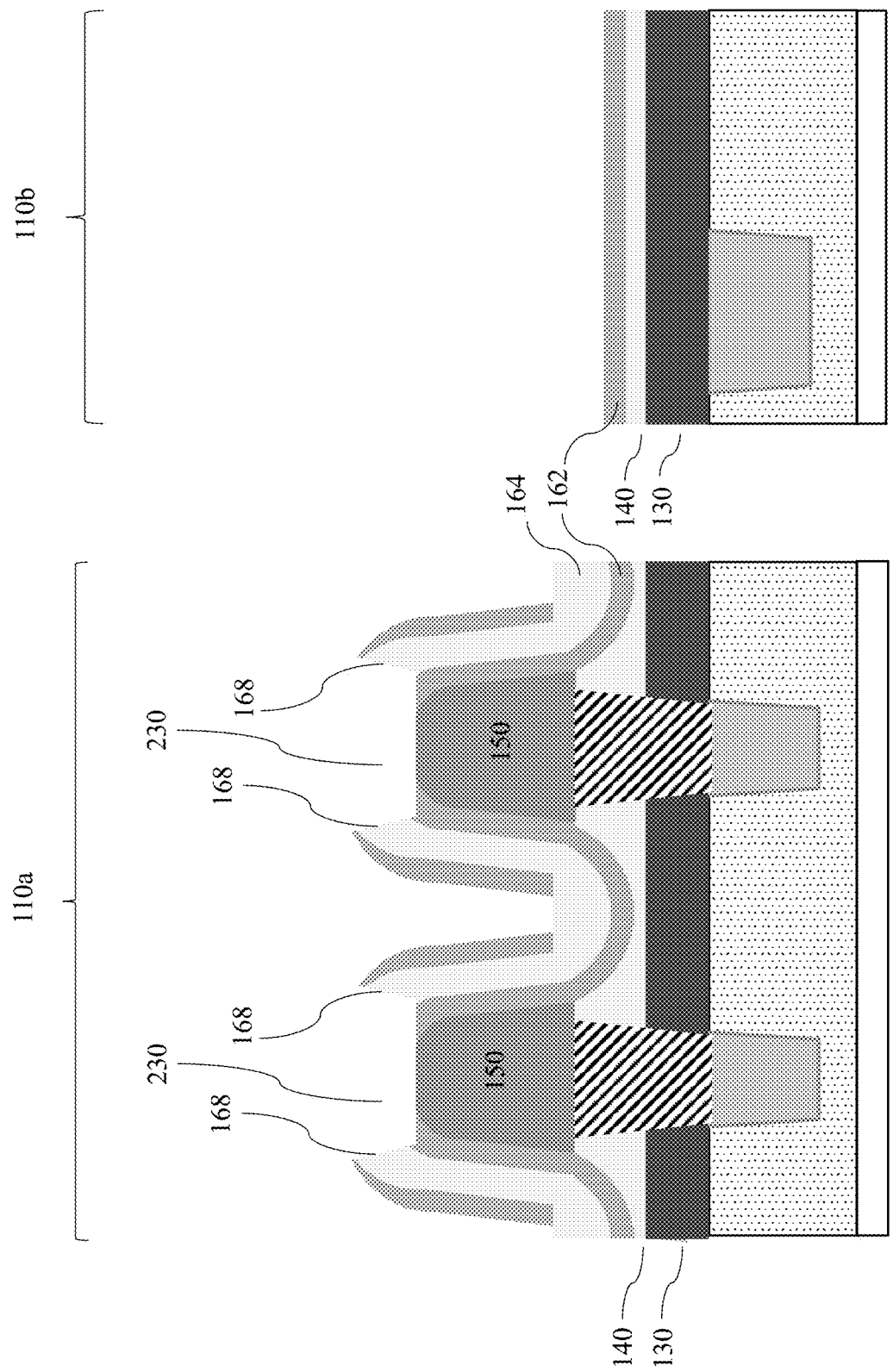

Referring to FIG. 2B, at least a portion of the first, second, and third encapsulation layers may be removed to form MTJ via openings 230 over the MTJ stacks. In one embodiment, a first etch may be performed to remove the portion of the first, second, and third encapsulation layers 162, 164 and 166 above the MTJ stacks to form MTJ via openings 230. In one embodiment, the first etch is a blanket etch process performed to remove portions of the first, second, and third encapsulation layers 162, 164 and 166 in the first and second regions 110*a* and 110*b*. For example, the first etch may be a dry etch such as a reactive ion etch (RIE). Other types of etching techniques may also be useful.

As shown, the first etch removes the portion of the first, second, and third encapsulation layers 162, 164 and 166 above the MTJ stacks to form MTJ via openings 230 and removes the second and third encapsulation layers 164 and 166 in the second region 110*b*. For example, the portion of the first, second, and third encapsulation layers 162, 164 and 166 above the MTJ stacks in first region 110*a* and the second and third encapsulation layers 164 and 166 in the second region 110*b* may be removed by a single etch. Some material of the first encapsulation layer 162 in the second region 110*b* may be removed by the etch, while leaving some material of the encapsulation layer 162 remaining in the second region 110*b*. In a non-limiting embodiment, the first etch may remove portions of the first, second, and third encapsulation layers at the same time, i.e. a single etch may be used to remove portions of the first, second, and third encapsulation layers. Moreover, the single etch is performed in the absence of a mask in a non-limiting embodiment.

The MTJ via openings are self-aligned over the MTJ stacks without using a mask. The position of the MTJ via openings are determined by the position of the pillar-shaped MTJ stacks. For example, the first etch may have high selectivity to the second encapsulation layer 164 relative to the third encapsulation layer 166 of the encapsulation stack. For example, the first etch may have high etch selectivity to the oxide layer 164 relative to the silicon nitride layer 166 of the encapsulation stack. Portions of the encapsulation stack lining sidewalls of the MTJ stack in the first region 110a may remain after the first etch. As shown, the sidewalls of the MTJ stack are encapsulated with the first, second and third encapsulation dielectric layers 162, 164 and 166 which form dielectric spacers around/over the MTJ stacks. In one embodiment, the first etch leaves peaks 168 of the encapsulation stack which are formed above the MTJ stacks. As illustrated, the first etch may remove the first encapsulation layer 162 above the MTJ stacks to expose a top surface of the MTJ stacks. In other embodiments, the top surface of the MTJ stacks may not be exposed after the first etch. For example, a portion of the first encapsulation layer 162 may remain on the top surface of the MTJ stacks. As described, the first etch is performed without using a mask. This advantageously reduces the number of masks used in the process for forming the device.

Figure 2C:
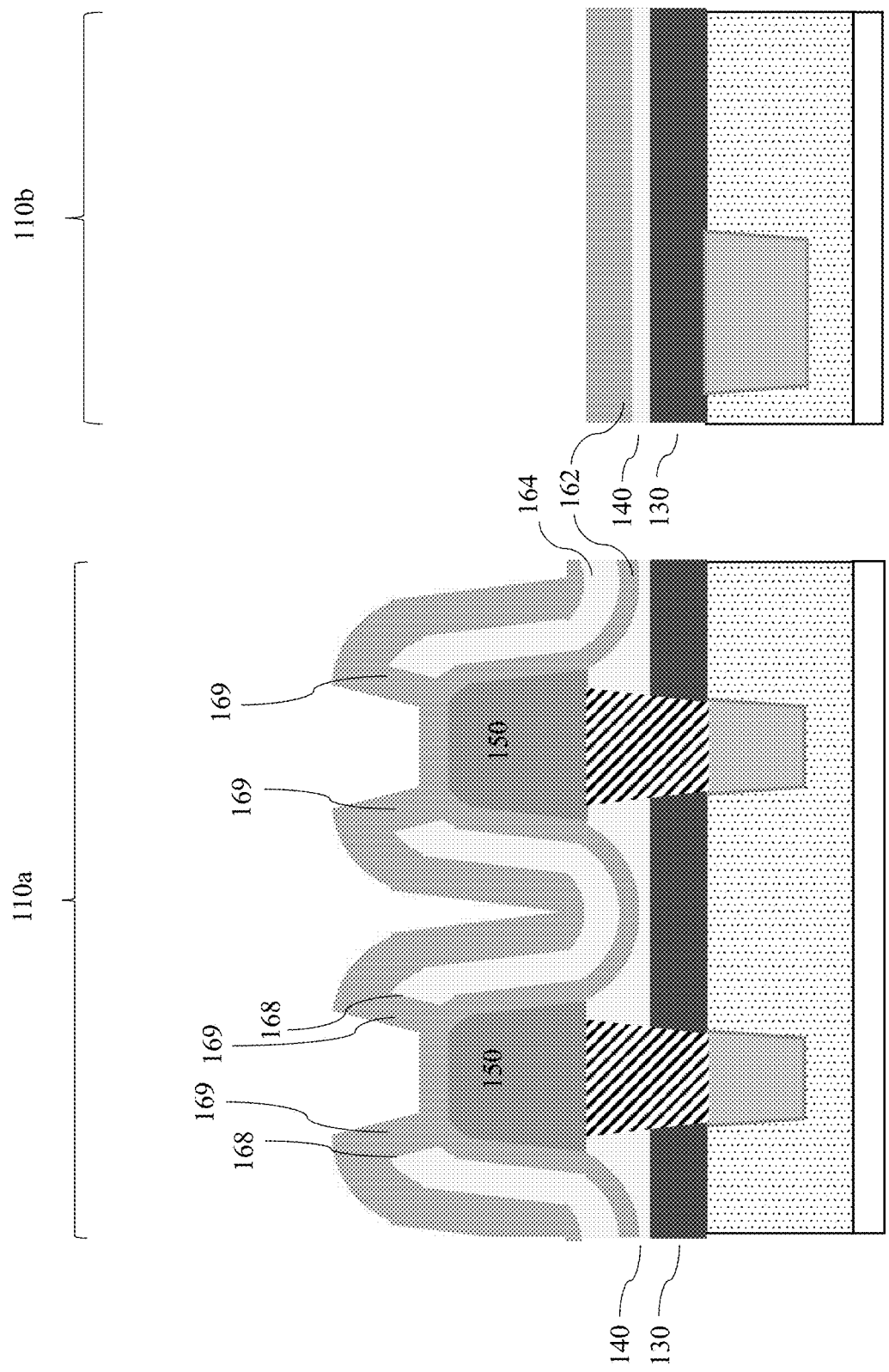

In a non-limiting embodiment, another (e.g. additional) dielectric material may be deposited over the substrate in the first and second regions 110a and 110b. In one embodiment, the dielectric material may be deposited at least partially along a sidewall of the one or more peaks 168 of the encapsulation stack. The deposition of the dielectric material at least partially forms another dielectric layer 169 along sidewalls of the peaks 168, as shown in FIG. 2C. For example, the dielectric material may be deposited to form one or more spacers around the MTJ stacks. A spacer, for example, includes the first encapsulation layer 162, second encapsulation layer 164 and third encapsulation layer 166 of the encapsulation stack which at least lines a sidewall of the MTJ stack and the dielectric layer 169 on a sidewall of the peak 168 of the encapsulation stack. The spacer may separate the MTJ stack from the second dielectric layer.

In one embodiment, the dielectric material of the dielectric layer 169 may be the same material as the third encapsulation layer 166 in a non-limiting embodiment. For example, the dielectric material may be silicon nitride, forming a silicon nitride layer 169 and the third encapsulation layer 166 may be a silicon nitride layer. The dielectric layer 169 on the sidewalls of the peaks 168 of the encapsulation stack, for example, defines the MTJ via openings above the MTJ stacks. The MTJ via openings and the spacers enable formation of self-aligned MTJ upper interconnects in the MTJ via openings over the MTJ stacks.

In a non-limiting embodiment, at least the first encapsulation layer 162 may be removed in the second region 110b to expose a top surface of the first dielectric layer 140 in the second region 110b, as shown in FIG. 2D. In one embodiment, a second etch may be performed to remove at least the first encapsulation layer 162 in the second region to expose a top surface of the first dielectric layer 140. For example, a blanket etch process may be performed until the first dielectric layer 140 in the second region 110b is exposed. The second etch removes some dielectric material in the MTJ via openings in the first region 110a. For example, the second etch may reduce a thickness of the dielectric layer 169 on the sidewalls of the peak 168 and dielectric material over the top surface of the MTJ stack. The blanket etch process may remove horizontal portions of dielectric material quicker than vertical portions as the lateral etch rate is much smaller than the vertical etch rate. For example, the second etch may be a dry etch such as an RIE. Other types of etching techniques may also be useful. The second etch may be performed without using a mask. For example, the first encapsulation layer 162 (e.g., silicon nitride layer) in the second region 110b may be removed in the absence of a mask.

Figure 2E:
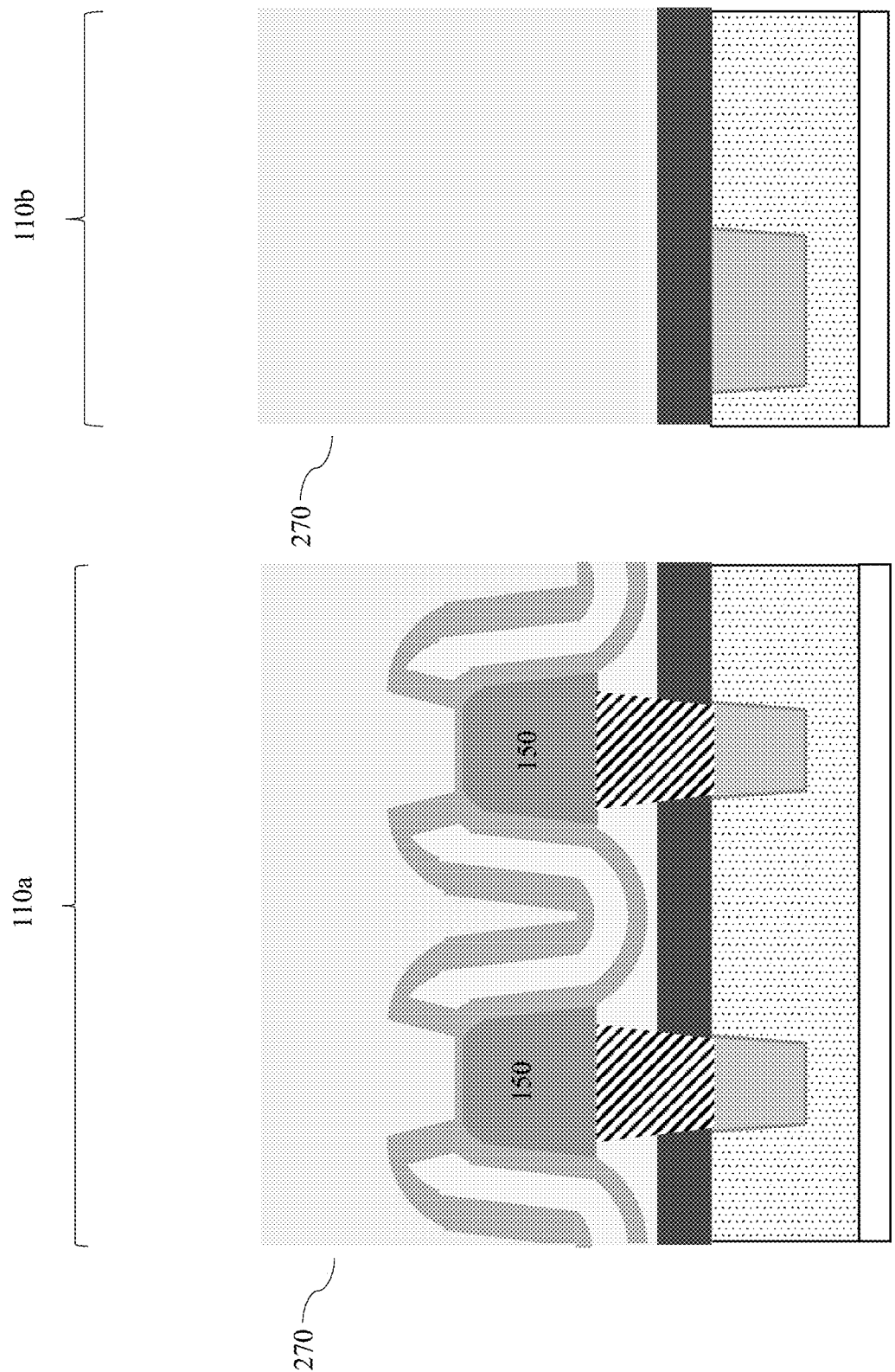

As illustrated, the MTJ via opening 230 may have a smaller dimension at the bottom of the opening relative to the top of the opening. A second dielectric layer 270 may be formed over the substrate in the first and second regions 110a and 110b, as illustrated in FIG. 2E. For example, the second dielectric layer 270 may be deposited over the first dielectric layer 140 and the MTJ stacks in the first region 110a and over the first dielectric layer 140 in the second region 110b. The second dielectric layer 270 fills the MTJ via openings and surrounds the MTJ stacks. The second dielectric layer 270 may be deposited, for example, by CVD. A planarization process may then be performed to form a substantially planar top surface of the second dielectric layer 270. For example, the planarization process forms a substantially planar top surface of the second dielectric layer 270 between the memory region and the logic region. For example, a planarization process such as chemical mechanical polishing or etch back with organic material coating may be performed. Other suitable techniques for forming and planarizing the second dielectric layer 270 may also be useful.

The second dielectric layer 270 may be formed of the same dielectric material as the first dielectric layer 140. In other embodiments, the second dielectric layer 270 may be formed of a different dielectric material from the first dielectric layer 140. In one embodiment, the second dielectric layer 270 may be formed of a low-k dielectric material, such as SiCOH. Other suitable materials for forming the second dielectric layer 270 may also be useful.

Figure 2F:
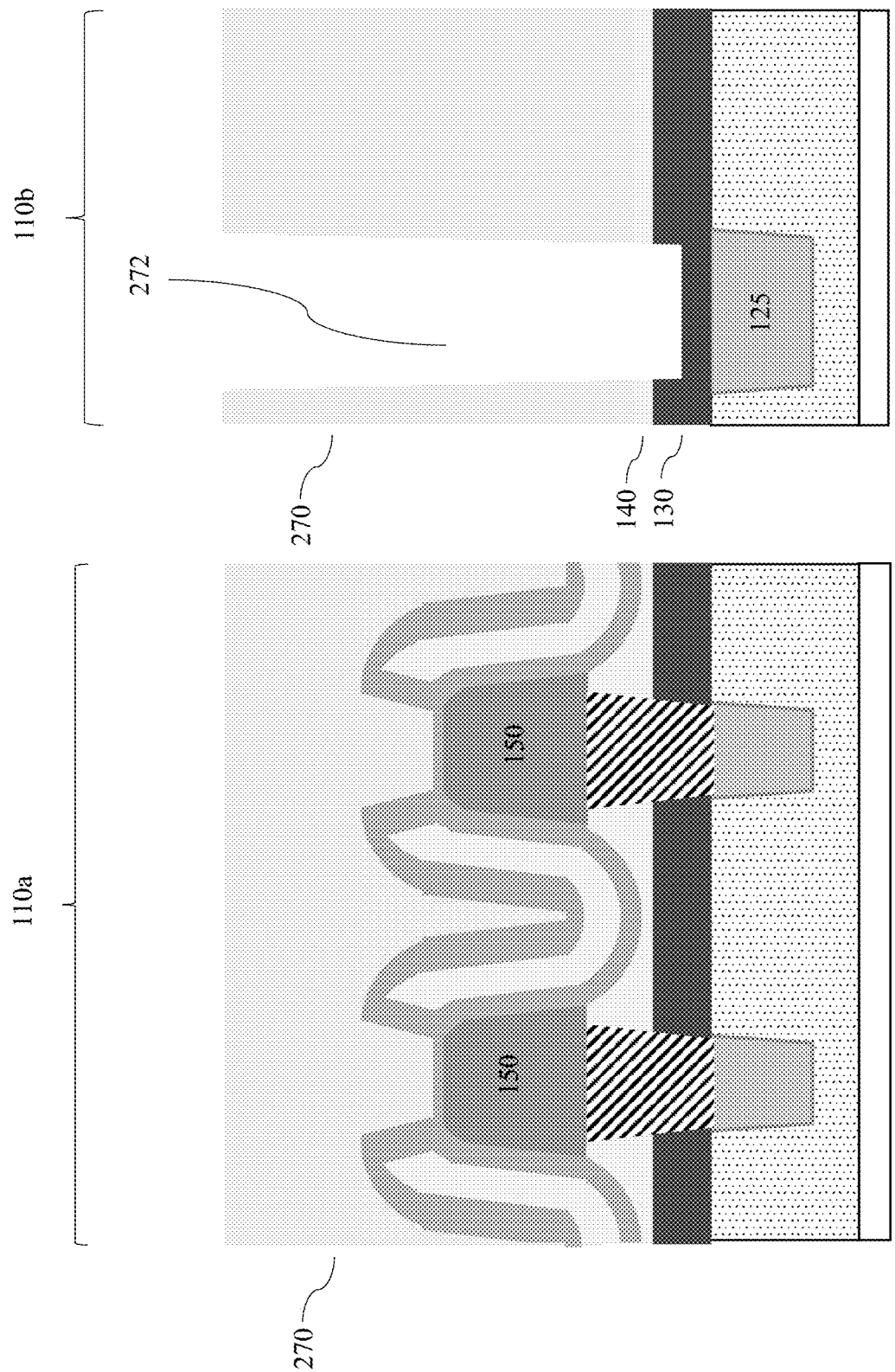

The upper MTJ interconnects and the logic interconnects may be formed in the second dielectric layer 270 in the first and second regions. In one embodiment, dual damascene processes may be employed to form MTJ upper interconnects in the first region 110a and logic interconnects in the second region 110b. Referring to FIG. 2F, the second dielectric layer 270, the first dielectric layer 140 and the capping layer 130 may be patterned to form a via opening 272 in the second region 110b. The via opening 272 may be formed, for example, by mask and etch techniques. For example, a patterned photoresist mask (not shown) may be formed over the second dielectric layer 270, serving as an etch mask. The patterned mask may have an opening which corresponds to the metal line 125 in the second region 110b. A third etch, for example, may be performed to remove exposed portions of the dielectric layers to form the via opening 272. The etch stops when a portion of the capping layer 130 is removed. For example, capping layer 130 serves as an etch stop layer. As shown, the third etch forms the via opening 272 in the second region 110b. The patterned mask may be removed using suitable techniques such as ashing, for example.

Figure 2G:
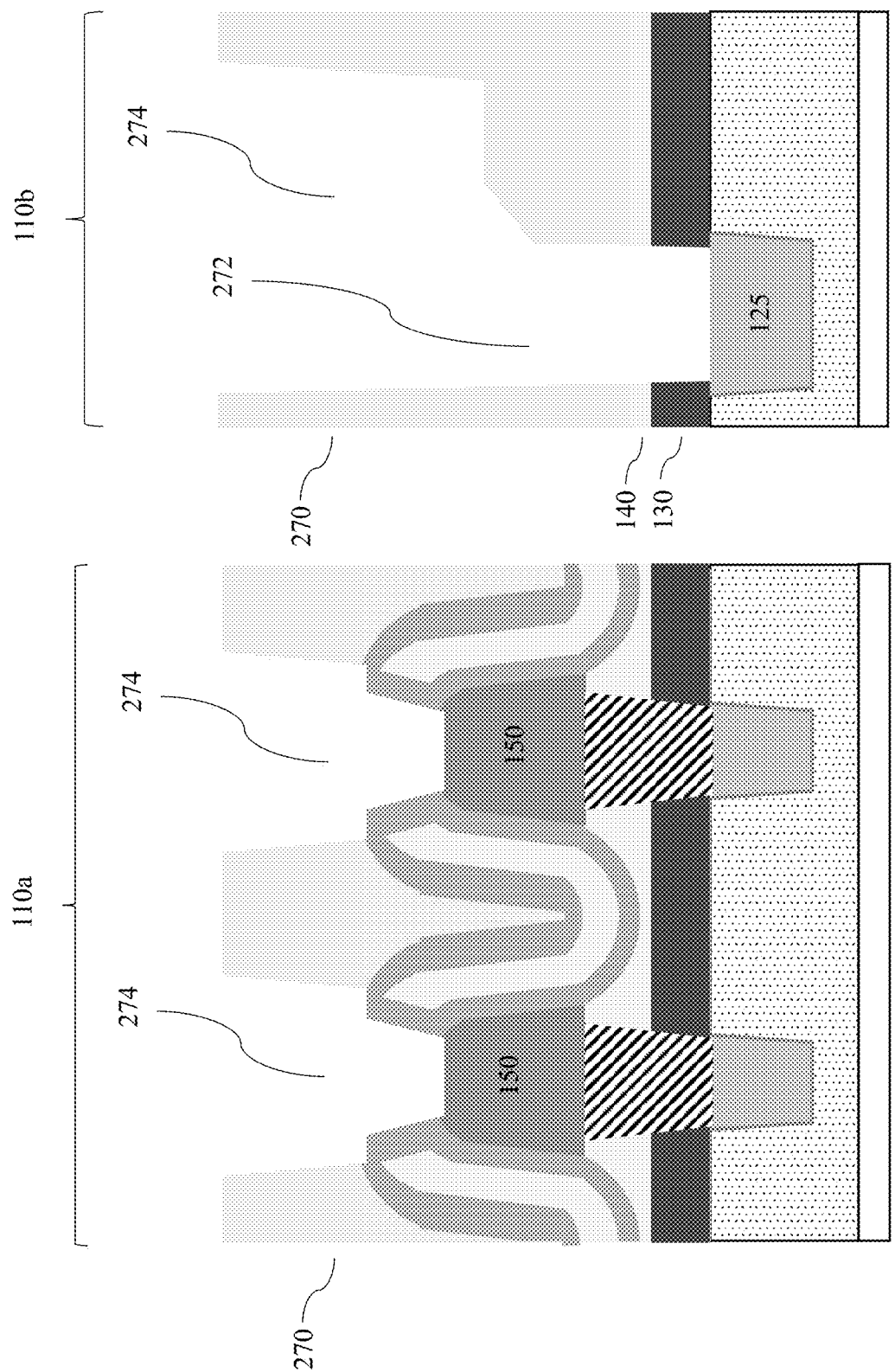

Referring to FIG. 2G, the second dielectric layer 270 may be patterned to define trenches 274 in the first region 110a and the second region 110b. For example, the second dielectric layer 270 may be patterned to form trenches 274 in the first and second regions simultaneously. In one embodiment, patterning the second dielectric layer 270 also removes horizontal portions of dielectric material over the top surface the MTJ stacks to expose the top surface the MTJ stacks. Further, the patterning also removes the exposed portion of the capping layer 130 to expose the top surface of the underlying metal line 125 in the second region 110b.

The trenches 274 may be formed, for example, by mask and etch techniques. For example, a mask such as a patterned photoresist mask (not shown) may be formed over the second dielectric layer 270, serving as an etch mask. The patterned mask may have openings which correspond to the MTJ stacks in the first region 110a and metal line 125 in the second region 110b. A fourth etch, for example, may be performed for a fixed time period to remove exposed portions of the dielectric layers to form the trenches 274. For example, the fourth etch may be highly selective to the second dielectric layer 270 and removes exposed portions of the second dielectric layer 270. The fourth etch patterns the second dielectric layer 270 in the first and second regions 110a and 110b, for example, using a single mask. This advantageously reduces the number of masks used in the process for forming the device.

In one embodiment, etching in the first region 110a by the fourth etch may be constrained by the spacers around the MTJ stack. As illustrated in FIG. 2G, etching in the first region 110a stops at the spacers and when the top surface of the MTJ stacks are exposed. The fourth etch in the second region 110b further removes an exposed portion of the capping layer 130 and extends a depth of the via opening 272 to expose a top surface of the metal line 125 in the second region 110b. For example, the metal line 125 serve as an etch stop layer for the via opening 272 in the second region 110b. The fourth etch stops in the second dielectric layer after a predefined time period to form the trench 274 in the second region 110b. The patterned mask may be removed using suitable techniques such as ashing, for example.

The process 200 continues to form a conductive layer over the substrate in the first and second regions 110a and 110b. The conductive layer covers the second dielectric layer 270 and fills the trenches 274 and logic via opening 272. In one embodiment, the conductive layer may be a conductive material such as Cu. In some embodiments, forming the conductive layer includes forming barrier materials such as Ta and TaN. The barrier material may be deposited over the substrate to form a barrier layer prior to depositing the conductive material. Other suitable types of conductive and barrier materials may also be useful. For example, the barrier layer lines the trenches and via openings (not shown). The conductive layer may be formed by, for example, electrochemical plating. Other suitable techniques for forming the conductive layer may also be useful.

Figure 2H:
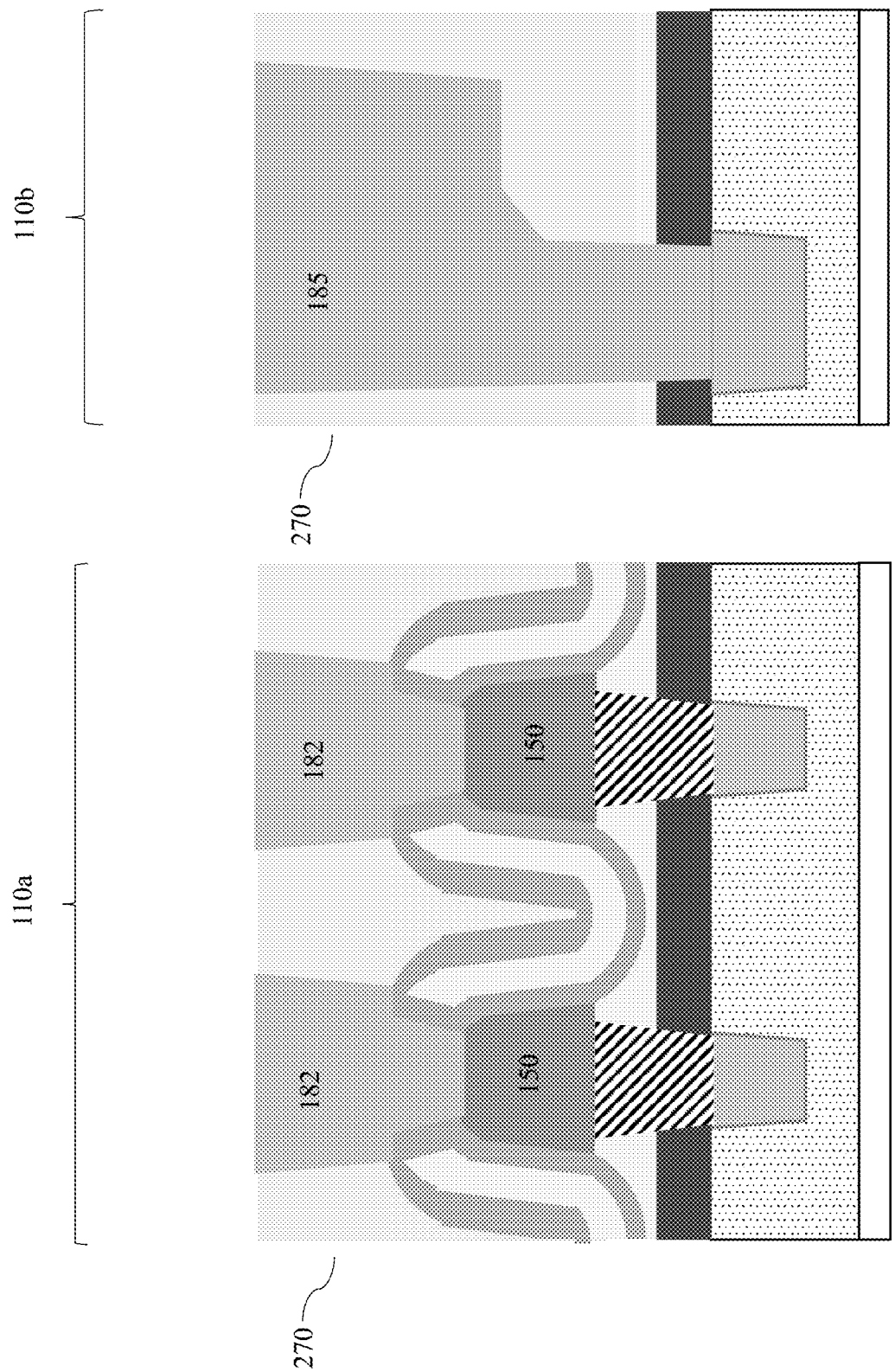

An anneal may then be performed. Excess conductive material may be removed by planarization such as CMP, forming upper interconnects in the first region 110a and the second region 110b. As shown in FIG. 2H, self-aligned MTJ upper interconnects 182 are formed over the MTJ stacks 150 in the first region 110a and logic interconnects 185 are formed over the underlying metal line 125 in the second region 110b. For example, the MTJ upper interconnects and logic interconnects may be formed simultaneously. The MTJ upper interconnects 182 and the logic interconnects 185 may be formed of the same conductive material.

The top surface of the upper interconnects is substantially planar with the top surface of the second dielectric layer 270. An MTJ upper interconnect 182, for example, extends from the top surface of the second dielectric layer 270 to the top surface of the MTJ stack, while a logic interconnect 185 extends from the top surface of the second dielectric layer 270 and through a depth of the second dielectric layer 270. The logic interconnect 185 further extends through a depth of the first dielectric layer 140 and the capping layer 130 to contact the underlying metal line 125 in the second region 110b.

The process continues to complete formation of the IC. The process, for example, may continue to form additional ILD levels of the interlevel dielectric with interconnects in these higher ILD levels, capping layer and pad interconnects or bonding pads. Further processing may include final passivation, dicing, assembly and packaging. Other processes may also be useful.

The process as described is highly compatible with logic processing or technology. For example, memory elements such as the MTJ stacks may be formed on the same substrate using logic processing. Further, the memory element may be integrated or embedded in between layers of the memory region using logic processing steps.

In addition, the process allows integrating MTJ stacks with logic components in BEOL layers with minimal number of masks. For example, the first etch and the second etch as described above may be performed without using mask. The process reduces the number of masks involved for integrating memory elements with logic components.

In accordance with one aspect, dielectric spacers may be formed around the MTJ stacks. The dielectric spacers enable formation of a self-aligned interconnect over the MTJ stack, i.e. the interconnect 'self-aligns' over the MTJ stack without the use of an additional mask. The self-aligned interconnect over the MTJ stack may have a dimension which is comparable or slightly smaller to a dimension of a top surface of the MTJ stack. The process also advantageously forms interconnects which contact the MTJ stacks and avoid open issues, for example, where the an interconnect extending to the MTJ stack is not long enough such that a portion of the dielectric remains between the interconnect and the MTJ stack. Further, the dielectric spacers around the MTJ stacks prevents or minimizes over-etching and shorting of the MTJ stacks.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate comprising at least a first region and a second region, wherein a first dielectric layer is arranged over a capping layer in the first region and the second region and where the first dielectric layer and the capping layer are arranged over the substrate; wherein the first region comprises a memory region over the first dielectric layer; and wherein the second region comprises a logic region;
   at least one magnetic tunnel junction (MTJ) stack arranged in the first region and a self-aligned MTJ via opening over the at least one MTJ stack;
   an encapsulation stack disposed around the at least one MTJ stack; wherein the encapsulation stack comprises a first layer over the first dielectric layer, a second layer over the first layer, and a third layer over the second layer; wherein the encapsulation stack comprises one or more peaks above the at least one MTJ stack;

another dielectric layer at least partially disposed along a sidewall of the one or more peaks to form one or more spacers around the at least one MTJ stack; and an MTJ upper interconnect disposed in the self-aligned MTJ via opening and over the at least one MTJ stack, wherein the MTJ upper interconnect is self-aligned to the one or more peaks of the encapsulation stack.

2. The device of claim 1, wherein the first layer and the third layer comprise silicon nitride.

3. The device of claim 2, wherein the second layer comprises silicon oxide.

4. The device of claim 2, wherein the another dielectric layer at least partially disposed along a sidewall of the one or more peaks comprises silicon nitride.

5. The device of claim 1, wherein the capping layer and the first dielectric layer further comprise a bottom electrode that couples the at least one MTJ stack to a metal line in the first region.

6. The device of claim 5, further comprising a logic interconnect disposed through the capping layer in the second region, and wherein the logic interconnect is coupled to a metal line in the second region.

7. The device of claim 6 wherein the MTJ upper interconnect in the first region and the logic interconnect in the second region comprise a same conductive material.

8. The device of claim 7, wherein the conductive material comprises copper.

9. The device of claim 1, wherein the at least one MTJ stack comprises a pillar-shaped MTJ stack arranged over the first dielectric layer and the capping layer.

10. The device of claim 1, wherein a top surface of the at least one MTJ stack is substantially planar.

11. The device of claim 1, wherein the at least one MTJ stack comprises a magnetically fixed layer, one or more tunneling barrier layers, and a magnetically free layer.

12. The device of claim 1, wherein the capping layer comprises an NBlok layer.

13. The device of claim 1, further comprising a second dielectric layer disposed over the first dielectric layer, the at least one MTJ stack, and the encapsulation stack, wherein the second dielectric layer surrounds the encapsulation stack and the MTJ upper interconnect.

14. The device of claim 13, wherein the second dielectric layer comprises a low-k dielectric material.

15. The device of claim 14, wherein the first dielectric layer comprises a low-k dielectric material.

* * * * *